(12) United States Patent
Van Der Mee et al.

(10) Patent No.: US 7,179,111 B2
(45) Date of Patent: Feb. 20, 2007

(54) ELECTRICAL CONNECTOR

(75) Inventors: Marnix Van Der Mee, Montlouis sur Loire (FR); Armel Baldyrou, Monthodon (FR); Stephane Geay, Authon (FR)

(73) Assignee: Radiall, Rosny-Sous-Bois (FR)

( * ) Notice: Subject to any disclaimer, the term of this patent is extended or adjusted under 35 U.S.C. 154(b) by 52 days.

(21) Appl. No.: 10/544,188

(22) PCT Filed: Feb. 3, 2004

(86) PCT No.: PCT/FR2004/000244

§ 371 (c)(1),
(2), (4) Date: Sep. 30, 2005

(87) PCT Pub. No.: WO2004/079871

PCT Pub. Date: Sep. 16, 2004

(65) Prior Publication Data
US 2006/0099854 A1    May 11, 2006

(30) Foreign Application Priority Data
Feb. 6, 2003    (FR) .................................. 03 001390

(51) Int. Cl.
*H01R 13/627*    (2006.01)
(52) U.S. Cl. ...................... 439/357; 439/353
(58) Field of Classification Search .............. 439/353, 439/357, 358
See application file for complete search history.

(56) References Cited

U.S. PATENT DOCUMENTS

| | | | | |
|---|---|---|---|---|
| 3,605,070 A | * | 9/1971 | Krafthefer | .................. 439/357 |
| 4,010,998 A | * | 3/1977 | Tolnar, Jr. et al. | .......... 439/358 |
| 4,431,244 A | * | 2/1984 | Anhalt et al. | ................ 439/358 |
| 4,900,261 A | * | 2/1990 | Gentry et al. | ................ 439/353 |
| 5,080,603 A | * | 1/1992 | Mouissie | ..................... 439/353 |
| 5,169,340 A | | 12/1992 | Nakata et al. | |
| 5,509,823 A | | 4/1996 | Harting et al. | |
| 5,921,808 A | * | 7/1999 | Haftmann et al. | .......... 439/495 |
| 6,139,350 A | | 10/2000 | Mathesius | |
| 6,428,341 B2 | * | 8/2002 | Kinezuka et al. | ........... 439/358 |
| 6,659,801 B2 | * | 12/2003 | Nishio et al. | ................ 439/610 |
| 2002/0090856 A1 | | 7/2002 | Weisz-Margulescu | |
| 2004/0033714 A1 | * | 2/2004 | Maini et al. | ................. 439/357 |

FOREIGN PATENT DOCUMENTS

| | | |
|---|---|---|
| EP | 0 415 489 A1 | 3/1991 |
| WO | WO 200/079871 A1 | 9/2004 |

\* cited by examiner

*Primary Examiner*—Tho D. Ta
(74) *Attorney, Agent, or Firm*—Oliff & Berridge, PLC

(57) ABSTRACT

The present invention provides an electrical connector having a housing comprising:
  a first housing element provided with at least a first connection portion that is either male or female; and
  a second housing element provided with at least one second connection portion that is either female or male, respectively, suitable for co-operating with the first connection portion;
  at least one of the first and second connection portions including at least one elastically deformable tab made integrally with the corresponding connection portion in the thickness of a cylindrical of said connection portion, which wall defines a single cavity that presents, in cross-section, at least one side in the form of a straight line segment, the tab extending, in cross-section, along said side, wherein the tab presents, in cross-section, a width that is greater than half the length of said side.

18 Claims, 2 Drawing Sheets

ELECTRICAL CONNECTOR

The present invention relates to an electrical connector.

BACKGROUND OF THE INVENTION

European patent EP 0 358 562 in the name of the Applicant company discloses a connector comprising housing elements, one of which carries a plurality of resilient blades at its periphery that are electrically connected to one another and also to the corresponding housing elements, these blades coming to press against the other housing elements on connection. These blades are held on the corresponding housing elements by means of a backing plate.

The above-specified connector has a relatively large number of parts.

In addition, the blades which are generally made out of a metal strip can become damaged under certain circumstances, under the effect of high levels of mechanical stress.

U.S. Pat. No. 6,139,350 describes a device comprising a cable connector suitable for being engaged in a corresponding plug. The plug has two pairs of locking hooks suitable for co-operating with depressions in the cable connector.

U.S. Pat. No. 5,509,823 describes a connector comprising a base body having resilient tabs formed thereon. The tabs are relatively narrow in width.

Patent application FR 2 693 845 describes a shielded electrical connector comprising two housings. That connector does not have a tab made in the thickness of a cylindrical wall of a connection portion.

Patent application EP 1 098 397 describes an electrical connector of the cylindrical type that is circular in cross-section.

OBJECTS AND SUMMARY OF THE INVENTION

The present invention seeks in particular to provide an improved connector.

The present invention provides an electrical connector having a housing comprising:

a first housing element provided with at least one first connection portion that is either male or female; and a second housing element provided with at least one second connection portion that is either female or male, respectively, suitable for co-operating with the first connection portion;

at least one of the first and second connection portions including at least one elastically deformable tab made integrally with the corresponding connection portion in the thickness of a cylindrical of said connection portion, which wall defines a single cavity that presents, in cross-section, at least one side in the form of a straight line segment, the tab extending, in cross-section, along said side, wherein the tab presents, in cross-section, a width that is greater than half the length of said side.

By means of the invention, the number of component parts of the connector can be reduced since a ground connection between the first and second housing elements can be provided by one or more elastically deformable tabs made integrally with one of said housing elements. This serves in particular to avoid using contact blades of the kind described in patent EP 0 358 562.

The structure of the connector is therefore simplified and its cost price can be reduced.

Because the tab(s) is/are made integrally with the corresponding connection portion, the connector can be more robust, e.g. in comparison with the connector described in patent EP 0 358 562 in which the contact blades might present smaller mechanical strength since they are made out of metal strip.

In addition, due to their resilience the tab(s) made on a given connection portion come to press against the other connection portion by exerting substantial stress thereagainst, thus making it possible to achieve good grounding between the two housing elements when they are connected together.

Furthermore, because of the resulting friction, the stress exerted by the tab(s) of one of the connection portions on the other connection portion serves to provide robust retention between the housing elements. The clearance between them can be reduced considerably and it has been found that the connector presents entirely satisfactory ability to withstand vibration under conditions of use that are difficult, as for example in the field of aviation.

Furthermore, in existing connectors, the ground connection takes place for the most part by an axial abutment between the two housing elements, when they are connected together. This configuration is generally refereed to as "shell-bottoming".

In the present invention, since a satisfactory ground connection can be ensured between the two housing elements via the elastically deformable tab(s), it is optionally possible to provide no axial abutment between the two housing elements.

Given that the connection portion has a single elastically deformable tab on the side of the above-mentioned straight line segment, with only two slots, one on either side of the tab, the invention makes it possible to limit any leakage associated with electromagnetic radiation interfering through the slots, in comparison with a connector having a relatively large number of tabs and thus of corresponding slots, like the connector described in U.S. Pat. No. 5,509,823.

Furthermore, until now, the tendency has been to seek to increase the number of contact points in order to provide electrical continuity, given the prejudice to the effect that using a relatively small number of tabs leads to a small number of contact points.

The Applicant company has discovered that a tab of relatively large width can offer a relatively large number of contact points because of the presence of microscopic irregularities on the tab that are generated during manufacture, e.g. by machining or by casting.

Another prejudice consists in considering that a relatively wide tab will be lacking in resilience.

In fact, the resilience of a tab depends to a large extent on its thickness, its height, and the material from which the tab is made, and not on its width.

In contrast, the total resilient force developed by the tab is indeed a function of the width of the tab.

In an embodiment of the invention, the cross-section of its cylindrical wall presents two sides in the form of substantially parallel straight line segments, in particular segments of substantially rectangular cross-section.

Each tab can be obtained, for example, by cutting through the cylindrical wall, or in a variant each tab can be the result of making the housing elements appropriately by casting.

Advantageously, the or each electrically deformable tab extends over a major fraction of the height of the connection portion.

The elastically deformable tab may present a free end that is remote from the base of the corresponding connection portion.

Preferably, the or each tab has a face that presses against the other connection portion that includes at least one portion in relief. The presence of this portion in relief enables the tab to press against the other connection portion with a relatively high level of stress.

The portion in relief may be situated on an inside face of the tab when the connection portion is of the female type, or in a variant it may be situated on the outside face of the tab when the connection portion is of the male type.

Preferably, when the tab has a top edge, the portion in relief is adjacent to said top edge, or at least is situated close thereto.

Thus, a ground connection between the housing elements can be established at the beginning of making a connection so that the first electrical contact takes place via the shielding and not via the conductors carried by the housing elements being connected together.

In an embodiment of the invention, the portion in relief is in the form of a rib extending transversely to the longitudinal direction of the tab. The rib may extend over the entire width of the tab.

In an embodiment of the invention, one of the connection portions has two facing tabs.

Each tab may be substantially plane in shape, and preferably rectangular.

On one side, each tab may extend over a straight line segment between the two ends of the side.

In an embodiment of the invention, the elastically deformable tab presses against a substantially plane wall of the other connection portion.

At least one of the connection portions may include two adjacent cavities separated by an intermediate wall.

Advantageously, the housing elements may be made of an electrically conductive material so as to provide the housing with shielding.

The housing elements may be made of metal, e.g. of aluminum. In a variant, the housing elements may be made of a plastics material that is metal-plated or that contains a conductive filler, in which case the housing elements can be made by molding, for example.

The conductors mounted inside the housing elements can be of the coaxial type.

The cylindrical wall may present a thickness of less than 1 centimeter (cm).

BRIEF DESCRIPTION OF THE DRAWINGS

The invention can be better understood on reading the following detailed description of non-limiting embodiments thereof, and on examining the accompanying drawings, in which.

MORE DETAILED DESCRIPTION

Figure 1:
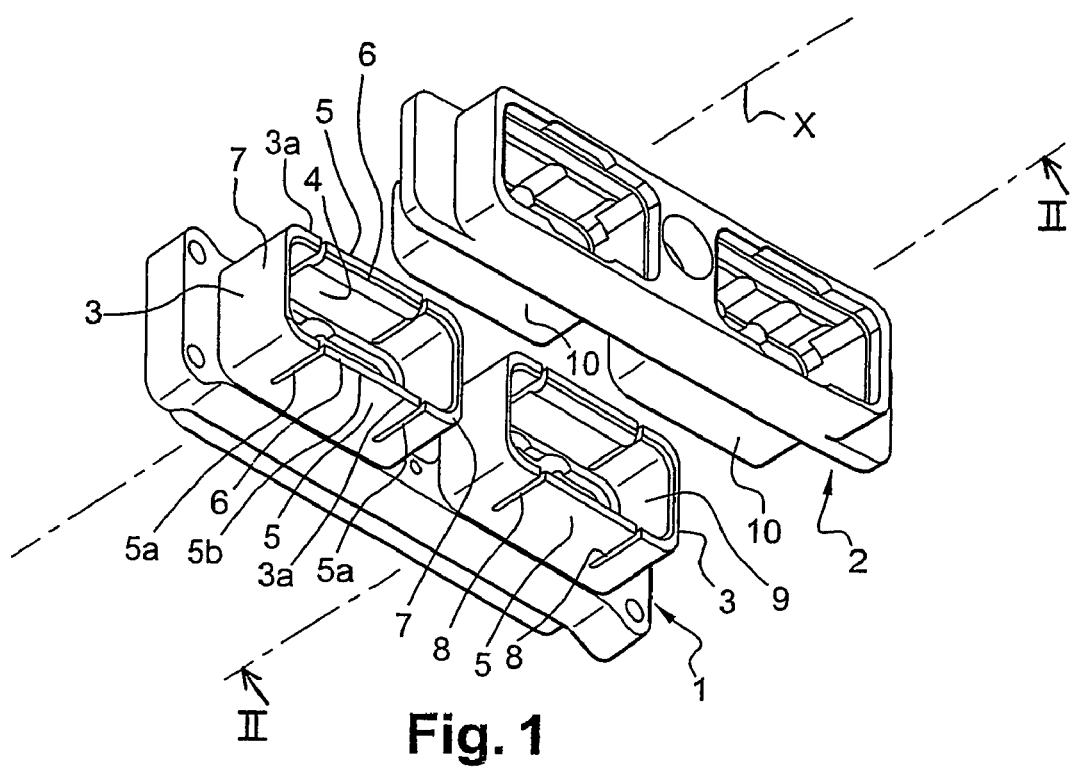
FIG. 1 is a diagrammatic and fragmentary perspective view of a connector housing in accordance with the invention.

FIG. 1 shows a first housing element 1 and a second housing element 2 of an electrical connector for assembling together to form a shielded housing.

In the example described, the housing elements 1 and 2 are made of aluminum and are designed to receive conductors that are held in insulating blocks (not shown).

By way of example, the conductors may be of coaxial type, or of some other type.

The housing element 1 has two female connection portions 3 each formed by a cylindrical wall of axis X and of cross-section that is substantially rectangular, each wall defining a single cavity 9.

On two opposite sides 3a of the rectangle, each connection portion 3 includes respective elastically deformable facing tabs 5 extending along the X axis over a major fraction of the height of the connection portion 3.

The tabs 5 are substantially rectangular in shape with two parallel side edges 5a and the top edge 5b.

Each connection portion or cylindrical wall 3 includes slots 8, situated on either side of each tab 5.

In cross-section, each tab 5 is of width that is greater than half the length of the corresponding side 3a.

Each of these elastically deformable tabs 5 has a rib 6 on its inside face, the rib extending transversely to the axis X, adjacent to the top edge 5b of the tab 5, and covering its entire width.

In the example described, the tabs 5 are made by being cut out from the cylindrical wall of the connection portion 3.

On either side of the tabs 5, the connection portion 3 has two wall portions 7 of substantially U-shaped cross-section that imparts satisfactory robustness to the connection portion 3.

The housing element 2 has two male connection portions 10, each suitable for engaging into a respective one of the cavities 9 of the female connection portions 3 of the housing element 1.

Each of these connection portions 10 is formed by a cylindrical wall of substantially rectangular cross-section.

Figure 2:
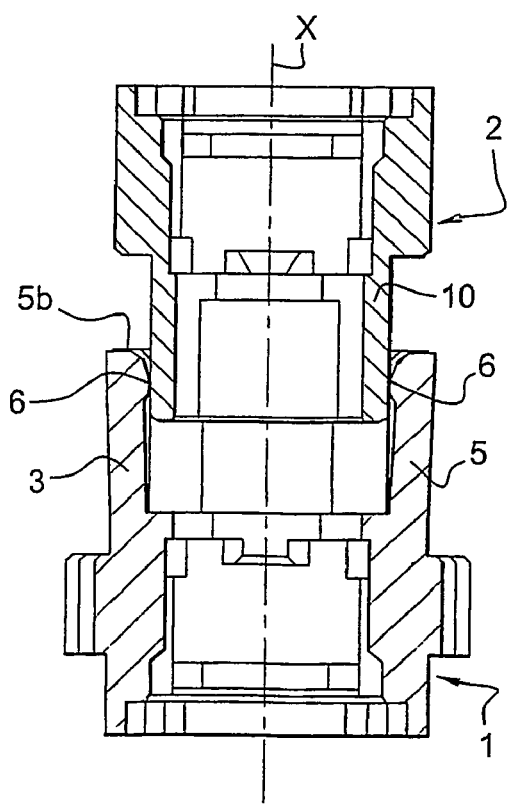
FIGS. 2 and 3 are diagrammatic and fragmentary section views on II—II of the FIG. 1 housing elements, and two successive stages while making a connection.

As can be seen in FIG. 2, at the beginning of engagement between a male connection portion 10 in a female connection portion 3, the tabs 5 are moved apart because of the presence of the ribs 6, so the ground connection can be established between the housing portions 1 and 2.

This provides a ground connection before the conductors (not shown) that are carried by the housing elements are interconnected.

Figure 3:
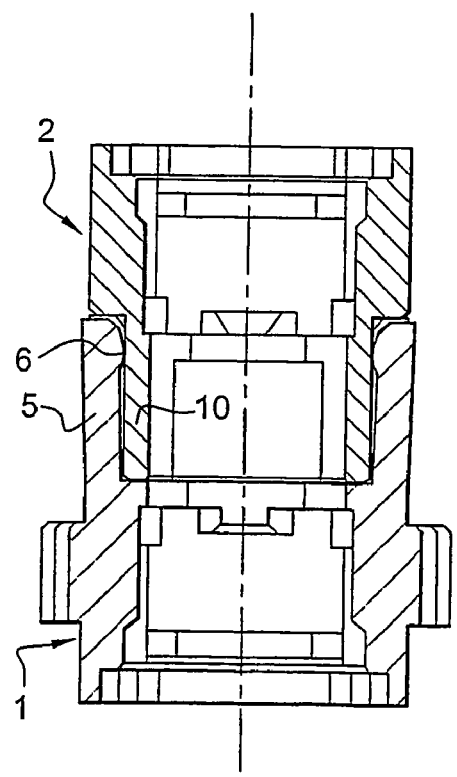

At the end of connection, as shown in FIG. 3, the tabs 5 are spaced apart slightly from their rest positions such that they continue to exert a relatively high level of stress on the cylindrical wall of the connection portion 10, thus ensuring a satisfactory ground connection between the housing elements 1 and 2.

In the above-described example, each connection portion 3 has only one pair of facing tabs 5.

Figure 4:
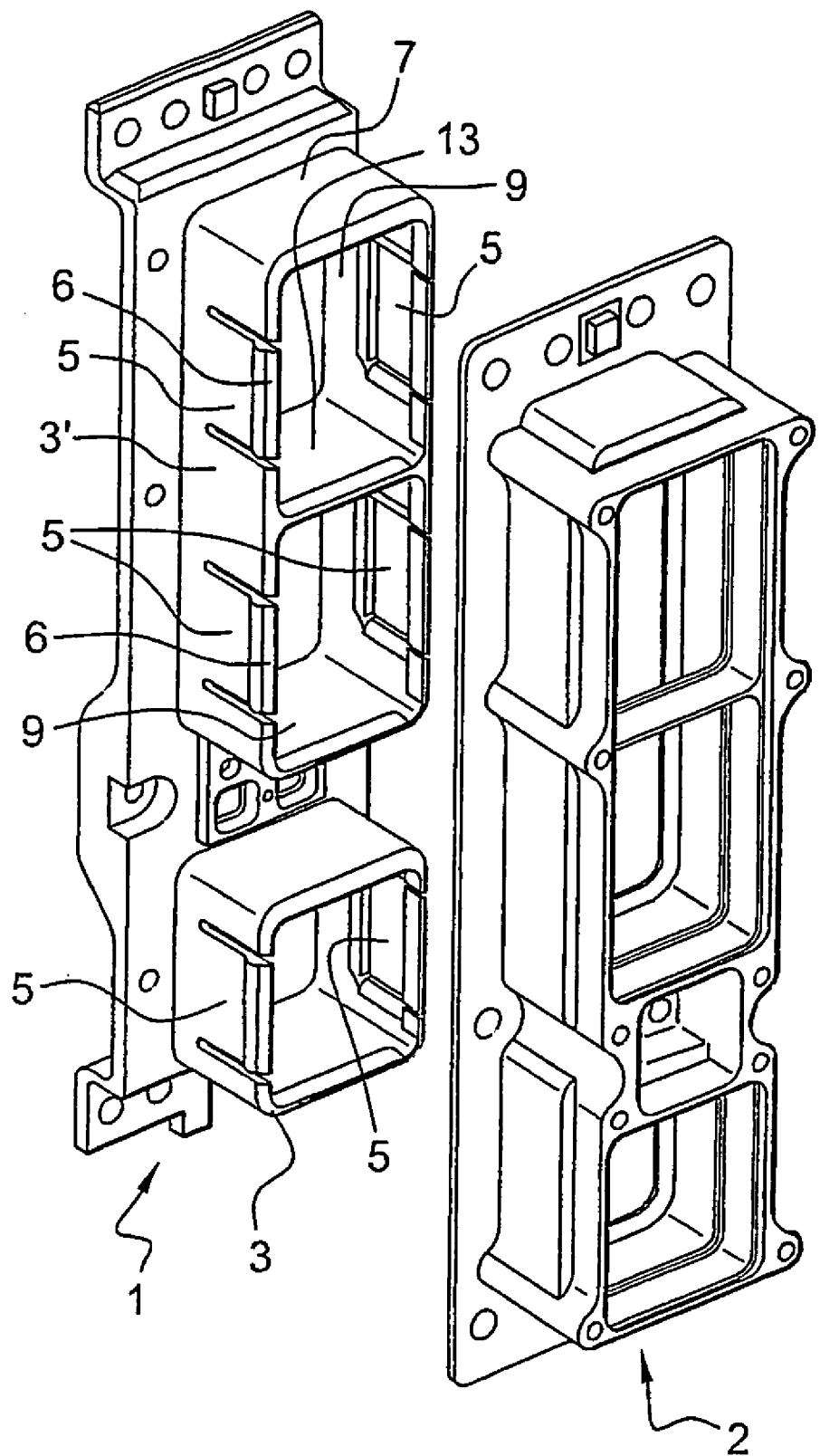
FIG. 4 is a diagrammatic and fragmentary perspective view showing a variant embodiment of the invention.

In a variant, as shown in FIG. 4, one of the connection portions 3' may have two pairs of facing tabs 5. In the example shown, the connection portion 3' is of the male type and the ribs 6 are situated on the outside faces of the tabs 5. The connection portion 3' has an intermediate partition wall 13 defining two separate cavities 9 for receiving the conductors.

In cross-section, each tab 5 presents a width that is greater than half the length of the side extending between the partition wall 13 and a side remote from said partition wall 13.

In the examples described above, each of the housing elements 1 and 2 comprises two separate connection portions, with respective references 3, 3', and 10.

It would not go beyond the ambit of the present invention for the housing elements to have some other number of connection portions. For example, each could have a single connection portion.

Naturally, the invention is not restricted to the embodiments described above.

It is possible to provide both male and female connection portions with tabs that come to bear against one another, or in a variant that alternate so as to press against a part of the wall of other connection portion that lies outside the tabs of said portion.

The elastically deformable tabs may include portions in relief other than a rib, for example bosses.

The cross-section of the connection portions may be other than rectangular.

For example they may be of substantially trapezoidal cross-section.

What is claimed is:

1. An electrical connector having a housing comprising:
   a first housing element provided with at least a first connection portion that is either male or female; and
   a second housing element provided with at least one second connection portion that is either female or male, respectively, suitable for co-operating with the first connection portion;
   at least one of the first and second connection portions comprising:
   a cylindrical wall extending parallel to an axis and defining a single cavity, said wall having a cross-section perpendicular to said axis, said wall having at least one elastically deformable tab made integrally therewith in the thickness of said wall, wherein the cavity comprises, in said cross-section, at least one side in the form of a straight line segment, said side having a length measured along said segment, wherein the tab extends along said side and has, in said cross-section, a width measured along said segment that is greater than half of the length of the side, and wherein the at least one tab is configured such that it deflects slightly outwardly relative to a rest position when first and second housing elements are assembled.

2. A connector according to claim 1, wherein said at least one elastically deformable tab extends over a major fraction of the height of the connection portion, said height being measured along said axis of the cylindrical wall.

3. A connector according to claim 1, wherein the elastically deformable tab presents a free end that is remote from a base of the corresponding connection portion.

4. A connector according to claim 1, wherein one of the connection portions has two facing elastically deformable tabs.

5. A connector according to claim 1, wherein each tab is substantially plane in shape, preferably being rectangular.

6. A connector according to claim 1, wherein the elastically deformable tab presses against a wall of the other connection portion that is substantially plane.

7. A connector according to claim 1, wherein at least one of the connection portions includes two adjacent cavities separated by an intermediate wall.

8. A connector according to claim 1, wherein the cylindrical wall presents a thickness that is less than 1 cm.

9. A connector according to claim 1, wherein the cylindrical wall presents, in cross-section, two sides forming substantially parallel straight line segments.

10. A connector according to claim 9, wherein the cylindrical wall presents a cross-section that is substantially rectangular.

11. A connector according to claim 1, wherein said at least one tab includes at least one portion in relief on a face that comes to bear against the other connection portion.

12. A connector according to claim 11, in which said at least one tab has a top edge, wherein said at least one portion in relief is adjacent to said top edge or is situated in the proximity thereof.

13. A connector according to claim 11, wherein the portion in relief is in the form of a rib extending transversely to the longitudinal direction of the tab.

14. A connector according to claim 13, wherein the rib extends over the entire width of the tab.

15. A connector according to claim 1, wherein the housing elements are made of an electrically conductive material so as to provide shielding for the housing.

16. A connector according to claim 15, wherein the housing elements are made of metal, in particular of aluminum.

17. An electrical connector having a housing comprising:
   a first housing element provided with at least a first connection portion that is either male or female; and
   a second housing element provided with at least one second connection portion that is either female or male, respectively, suitable for co-operating with the first connection portion;
   at least one of the first and second connection portions comprising:
   a cylindrical wall extending parallel to an axis and defining a single cavity, said wall having a cross-section perpendicular to said axis, said wall having at least one elastically deformable tab made integrally therewith in the thickness of said wall, wherein the cavity comprises, in said cross-section, at least one side in the form of a straight line segment, said side having a length measured along said segment, wherein the tab extends along said side and has, in said cross-section, a width measured along said segment that is greater than half of the length of the side, and wherein the housing elements comprise an electrically conductive material so as to provide shielding for the housing.

18. An electrical connector having a housing comprising:
   a first housing element provided with at least a first connection portion that is either male or female; and
   a second housing element provided with at least one second connection portion that is either female or male, respectively, suitable for co-operating with the first connection portion;
   at least one of the first and second connection portions comprising:
   a cylindrical wall extending parallel to an axis and defining a single cavity, said wall having a cross-section perpendicular to said axis, said wall having at least one elastically deformable tab made integrally therewith in the thickness of said wall, wherein the cavity comprises, in said cross-section, at least one side in the form of a straight line segment, said side having a length measured along said segment, wherein the tab extends along said side and has, in said cross-section, a width measured along said segment that is greater than half of the length of the side, and wherein said at least one tab presses against a wall of the other connection portion, said wall being substantially plane and parallel to said axis, when the housing elements are assembled.

* * * * *